(12) United States Patent
Katsuma (10) Patent No.: US 12,115,586 B2
(45) Date of Patent: Oct. 15, 2024

(54) COATED TOOL AND CUTTING TOOL

(71) Applicant: KYOCERA CORPORATION, Kyoto (JP)

(72) Inventor: Tadashi Katsuma, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 751 days.

(21) Appl. No.: 17/273,733

(22) PCT Filed: Sep. 3, 2019

(86) PCT No.: PCT/JP2019/034600
§ 371 (c)(1),
(2) Date: Mar. 5, 2021

(87) PCT Pub. No.: WO2020/050264
PCT Pub. Date: Mar. 12, 2020

(65) Prior Publication Data
US 2021/0187623 A1    Jun. 24, 2021

(30) Foreign Application Priority Data
Sep. 5, 2018 (JP) .................................. 2018-166092

(51) Int. Cl.
*B23B 27/14* (2006.01)
*C23C 16/36* (2006.01)
*C23C 16/40* (2006.01)

(52) U.S. Cl.
CPC ............ *B23B 27/148* (2013.01); *C23C 16/36* (2013.01); *C23C 16/403* (2013.01); *B23B 2228/10* (2013.01)

(58) Field of Classification Search
CPC ..... B23B 27/148; C23C 16/403; C23C 16/36; C23C 16/34
See application file for complete search history.

(56) References Cited

U.S. PATENT DOCUMENTS

| 5,915,162 A | 6/1999 | Uchino et al. |
| 6,344,265 B1 | 2/2002 | Blomstedt et al. |
| 6,756,111 B1 * | 6/2004 | Okada ............... C23C 30/005 428/142 |
| 9,987,687 B2 | 6/2018 | Lindahl et al. |

(Continued)

FOREIGN PATENT DOCUMENTS

| EP | 2703102 A1 | 3/2014 | |
| JP | 07100701 A * | 4/1995 | ............. C23C 16/32 |

(Continued)

*Primary Examiner* — Kevin Ct Li
(74) *Attorney, Agent, or Firm* — VIERING, JENTSCHURA & PARTNER MBB (57) ABSTRACT

A coated tool may include a base member including a first surface, and a coating layer located at least on the first surface of the base member. The coating layer may include a first layer which is located on the first surface and which includes cubic titanium carbonitride, and a second layer which is contactedly located on the first layer. The first layer may include an orientation coefficient Tc (220) of the titanium carbonitride by X-ray diffraction analysis of 3.0 or more. The coating layer may include a plurality of voids located side by side in the first layer. An average value of widths of the voids in a direction along the interface may be less than an average value of distances between the voids adjacent to each other.

12 Claims, 7 Drawing Sheets

(56) References Cited

U.S. PATENT DOCUMENTS

| | | | |
|---|---|---|---|
| 11,253,926 B2 | 2/2022 | Katsuma | |
| 2005/0123366 A1* | 6/2005 | Goudemond | B23B 27/141 407/113 |
| 2006/0003187 A1 | 1/2006 | Osada et al. | |
| 2009/0044415 A1 | 2/2009 | Fujino et al. | |
| 2012/0202032 A1* | 8/2012 | Tatsuoka | C23C 30/005 428/216 |
| 2014/0193624 A1* | 7/2014 | Stiens | C23C 28/044 428/216 |
| 2014/0308083 A1 | 10/2014 | Bjormander | |
| 2015/0003925 A1* | 1/2015 | Ostlund | C23C 16/36 407/119 |
| 2016/0138153 A1 | 5/2016 | Sobiech et al. | |
| 2016/0175940 A1* | 6/2016 | Lindahl | C23C 16/0272 428/141 |
| 2017/0190591 A1 | 7/2017 | Imamura et al. | |
| 2017/0259344 A1 | 9/2017 | Katsuma | |
| 2019/0039148 A1 | 2/2019 | Kubo et al. | |
| 2019/0232380 A1 | 8/2019 | Kanaoka et al. | |
| 2021/0187624 A1 | 6/2021 | Katsuma | |
| 2021/0197289 A1 | 7/2021 | Katsuma | |
| 2021/0220920 A1 | 7/2021 | Katsuma | |
| 2021/0245260 A1 | 8/2021 | Katsuma | |
| 2021/0339320 A1 | 11/2021 | Katsuma | |

FOREIGN PATENT DOCUMENTS

| | | |
|---|---|---|
| JP | H07100701 A | 4/1995 |
| JP | H08300203 A | 11/1996 |
| JP | 2000071108 A | 3/2000 |
| JP | 2006015426 A | 1/2006 |
| JP | 2006116621 A | 5/2006 |
| JP | 2006231422 A | 9/2006 |
| JP | 2009107028 A | 5/2009 |
| JP | 2012187659 A | 10/2012 |
| JP | 2013126709 A | 6/2013 |
| JP | 2015009358 A | 1/2015 |
| JP | 2015182209 A | 10/2015 |
| JP | 2015188995 A | 11/2015 |
| JP | 6026468 B2 | 10/2016 |
| JP | 2017042901 A | 3/2017 |
| JP | 6238904 B2 | 11/2017 |
| JP | 2017221992 A | 12/2017 |
| JP | 2018103288 A | 7/2018 |
| WO | 0079022 A1 | 12/2000 |
| WO | 2006104004 A1 | 10/2006 |
| WO | 2012144088 A1 | 10/2012 |
| WO | 2017146200 A1 | 8/2017 |
| WO | 2017204141 A1 | 11/2017 |

* cited by examiner

COATED TOOL AND CUTTING TOOL

CROSS-REFERENCE TO RELATED APPLICATIONS

This application is a national stage entry according to 35 U.S.C. § 371 of PCT Application No. PCT/JP2019/034600 filed on Sep. 3, 2019, which claims priority to Japanese Application No. 2018-166092 filed on Sep. 5, 2018, which are entirely incorporated herein by reference.

TECHNICAL FIELD

The present disclosure relates to a coated tool for use in a cutting process.

BACKGROUND

As a coated tool for use in the cutting process, such as a turning process and a milling process, a coated tool is discussed in, for example, Patent Document 1 (Japanese Unexamined Patent Publication No. H8-300203).

In Patent Document 1, it is discussed that a titanium compound layer is oriented in a (220) surface, which may strengthen the adhesion of the layer to a substrate or the layer below, making it difficult for delamination to occur from an interface, and suppressing the occurrence of unusual damage and life degradation caused by delamination.

The coated tool discussed in Patent Document 2 (Japanese Unexamined Patent Publication No. 2015-182209) may include a configuration in which a coating layer is located on a surface of a base member composed of cemented carbide or the like. The coating layer may include a layer (titanium compound layer) including a compound of titanium (Ti) and a layer (aluminum oxide layer) including aluminum oxide ($Al_2O_3$). Additionally, in the coated tool discussed in Patent Document 2, a plurality of voids may be formed at an interface between the titanium compound layer and the aluminum oxide layer. There is discussion that impact relaxation effect may be obtainable because of the plurality of voids.

SUMMARY

A coated tool of the present disclosure may include a base member including a first surface, and a coating layer located at least on the first surface of the base member. The coating layer may include a first layer and a second layer. The first layer may be located on the first surface and includes cubic titanium carbonitride. The second layer may be contactedly located on the first layer and includes aluminum oxide. The first layer may include an orientation coefficient Tc (220) of the titanium carbonitride by X-ray diffraction analysis of 3.0 or more. The coating layer may include a plurality of voids located side by side in the first layer, in a direction along a boundary between the first layer and the second layer in a cross section orthogonal to the first surface. An average value of widths of the voids in a direction along the interface may be less than an average value of distances between the voids adjacent to each other.

A cutting tool of the present disclosure may include a holder including a bar shape which extends from a first end to a second end and including a pocket located at a side of the first end, and the above coated tool which is located at the pocket.

DETAILED DESCRIPTION

A coated tool of the present disclosure is described in detail below with reference to the drawings. For the sake of description, each of the drawings referred to in the following illustrates, in a simplified form, only main members necessary for the explanation. Hence, the coated tool is capable of including any structural member not illustrated in the drawings referred to. Dimensions of the members in each of the drawings are not ones which faithfully represent dimensions of actual structural members and dimension ratios of these members.

<Coated Tool>

Figure 1:
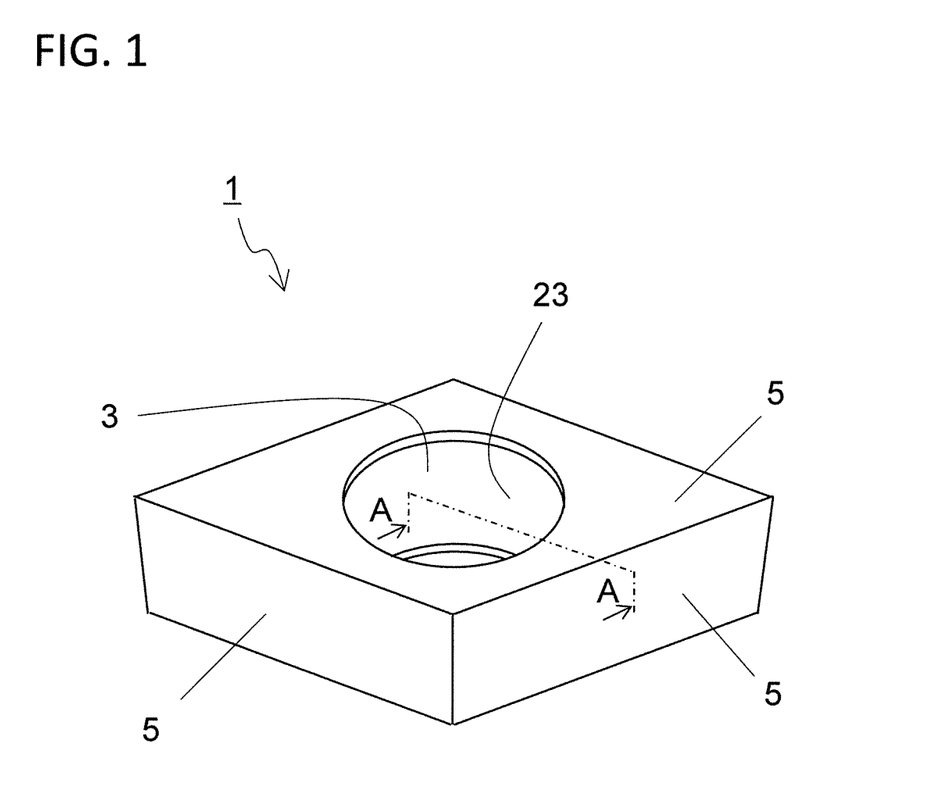
FIG. 1 is a perspective view illustrating a coated tool of the present disclosure.
Figure 2:
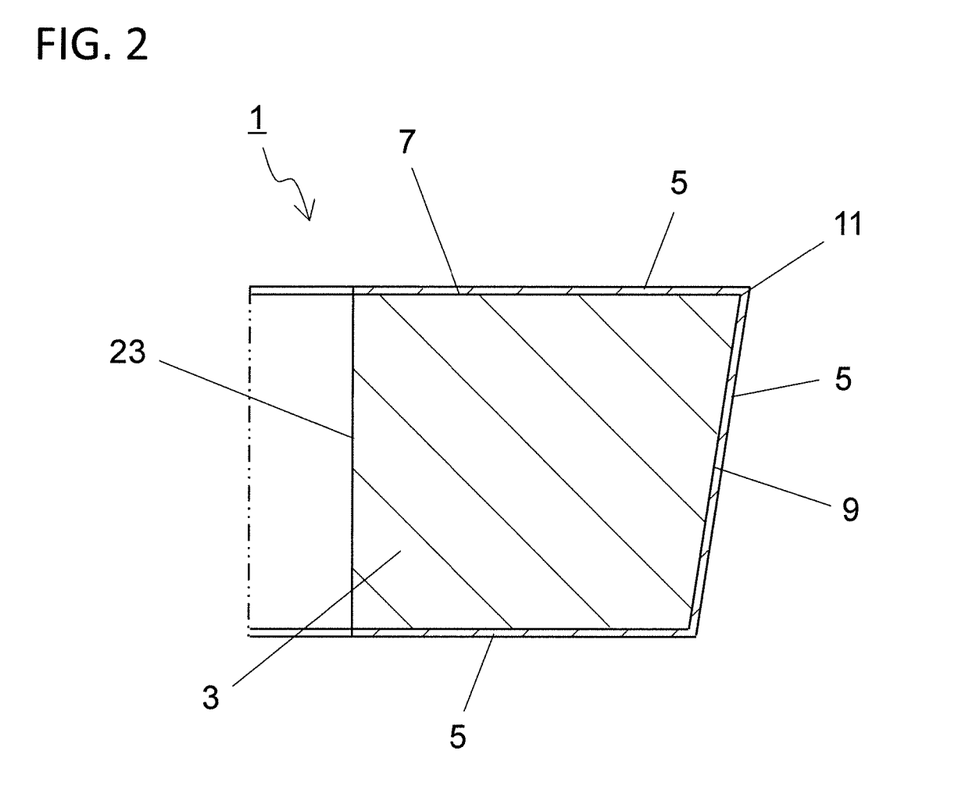
FIG. 2 is a sectional view taken along line A-A in the coated tool illustrated in FIG. 1.

The coated tool 1 of the present disclosure includes a base member 3 and a coating layer 5 as illustrated in FIGS. 1 and 2. The base member 3 includes a first surface 7 (an upper surface in FIG. 2), a second surface 9 adjacent to the first surface 7 (a side surface in FIG. 2), and a cutting edge 11 located at least on a part of a ridge line where the first surface 7 intersects with the second surface 9.

The base member 3 has a quadrangular plate shape in the example shown in FIG. 1, and the first surface 7 has a quadrangular shape. The number of the second surfaces 9 is therefore four. At least a part of the first surface 7 is a rake surface region, and at least a part of the second surface 9 is a flank surface region. The shape of the base member 3 is not limited to the quadrangular plate shape, and for example, the first surface 7 may have a triangular, pentagonal, hexagon or circular shape. Alternatively, the base member 3 may have a columnar shape besides the plate shape.

The coating layer 5 is located at least on the first surface 7 of the base member 3. The coating layer 5 may be located only on the first surface 7 or on a surface other than the first surface 7 in the base member 3. The coating layer 5 is also located on the second surface 9 in addition to the first surface 7 in the example shown in FIG. 2. The coating layer 5 is included for the purpose of improving characteristics of the coated tool 1 during a cutting process, such as wear resistance and chipping resistance.

Figure 3:
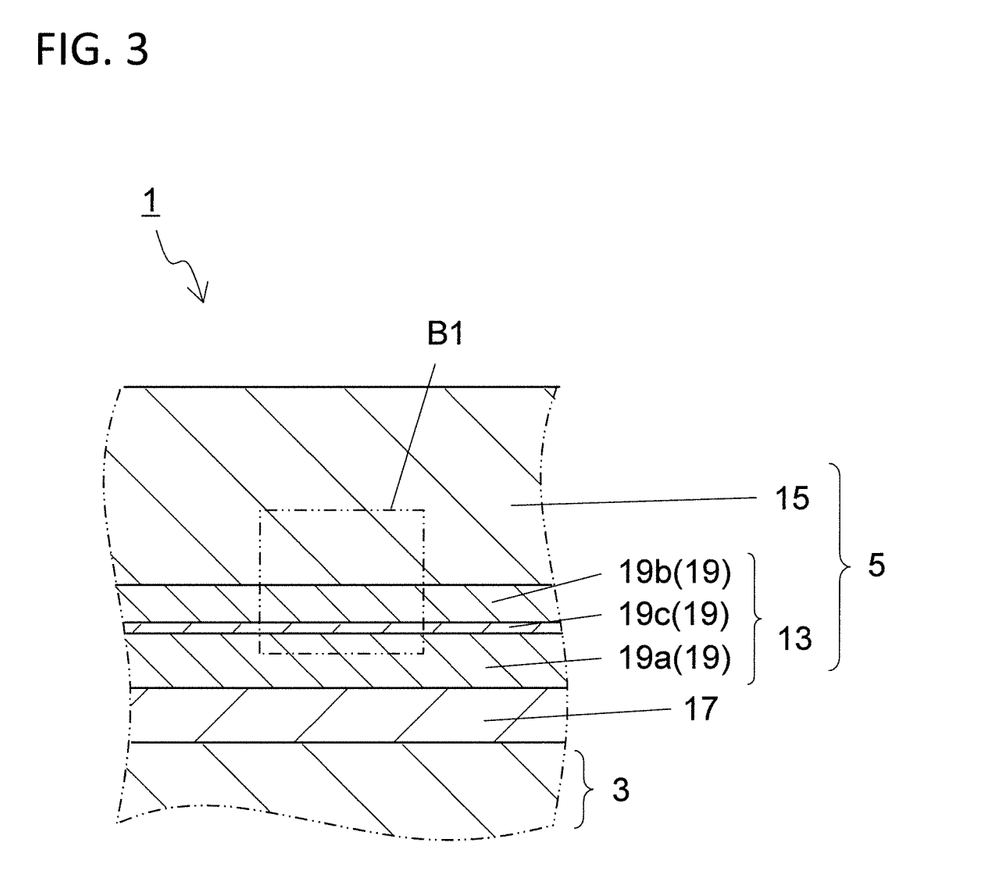
FIG. 3 is an enlarged view in the vicinity of a coating layer in the coated tool illustrated in FIG. 2.

The coating layer 5 includes a first layer 13 and a second layer 15 as illustrated in FIG. 3. The first layer 13 is located on the first surface 7 and includes cubic titanium carbonitride. The second layer 15 is contactedly located on the first layer 13. The second layer 15 may include, for example, aluminum oxide ($Al_2O_3$).

In addition, for example, a titanium nitride layer 17 may be included between the first layer 13 and the base member 3. Bondability between the base member 3 and the first layer 13 becomes higher if such a configuration is included.

The first layer 13 includes a titanium carbonitride layer 19. Other than the titanium carbonitride, the first layer 13 may include, for example, titanium carbide, nitride, oxide, carbon oxide and oxycarbonitride. The first layer 13 may be made into a single layer or, alternatively, may include a configuration in which a plurality of layers are laminated one on another as long as it includes cubic titanium carbonitride.

The titanium nitride layer 17 and the titanium carbonitride layer 19 include titanium nitride and titanium carbonitride as a main component, respectively, and may contain other components. The term "main component" denotes a component having the largest value in mass % among values of other components.

The coating layer 5 may be composed only of the first layer 13 and the second layer 15 or, alternatively, may include a layer other than these layers. For example, a different layer may be interposed between the base member 3 and the first layer 13 or, alternatively, a different layer may be located on the second layer 15.

The titanium carbonitride layer 19 may include a configuration in which a plurality of regions different in composition are laminated one on another. For example, the titanium carbonitride layer 19 may include a configuration in which a so-called MT (moderate temperature) first region 19a, and a so-called HT (high temperature) second region 19b are laminated one on another.

In cases where the first layer 13 includes the first region 19a and the second region 19b, the first layer 13 may further include an intermediate region 19c between the first region 19a and the second region 19b. A boundary between the layers and a boundary between the regions can be determined, for example, by observing an electron microscope photograph (a scanning electron microscope (SEM: Scanning Electron Microscope) photograph or a transmission electron microscope (TEM: Transmission Electron Microscope) photograph). Identification can be performed by the ratio of elements constituting each layer and differences in a size or an orientation of a crystal.

The first layer 13 includes the highest peak in a (220) surface among crystal surfaces of the cubic titanium carbonitride by X-ray diffraction (XRD) analysis and satisfies an orientation coefficient Tc (220) of 3.0 or more, which strengthens the adhesion of the layer to a substrate 3 or the layer below. This makes it difficult for delamination to occur from an interface, and suppresses the occurrence of unusual damage and life degradation caused by delamination.

The orientation coefficient Tc (hkl) can be calculated by the following formula.

$$Tc(hkl) = \{I(hkl)/I_0(hkl)\}/[(1/7) \times \Sigma\{I(HKL)/I_0(HKL)\}]$$

Here, (HKL) is crystal surfaces of (111), (200), (220), (311), (331), (420), and (422). I(HKL) and I(hkl) are peak intensities of the peaks attributed to each crystal surface detected in the X-ray diffraction analysis of the cubic titanium carbonitride of the first layer. $I_0$(HKL) and $I_0$(hkl) are standard diffraction intensities of each crystal surface described in JCPDS card No. 00-042-1489.

The above orientation coefficient Tc (hkl) may be measured from the upper surface of the first layer 13, for example, at a rake surface 9.

If the second layer 15 includes aluminum oxide, examples include α-alumina(α-$Al_2O_3$), γ-alumina(γ-$Al_2O_3$) and κ-alumina(κ-$Al_2O_3$). If the second layer 15 includes α-alumina of these, heat resistance of the coated tool 1 can be enhanced. The second layer 15 may be configured to include only one of the above compounds or, alternatively, may include a plurality of kinds of the above compounds.

Identification of the aluminum oxide included in the second layer 15 from among the above compounds can be evaluated, for example, by carrying out X-ray diffraction (XRD) analysis and by observing a distribution of peak values.

A content ratio of the titanium carbonitride in the first layer 13 and a content ratio of the aluminum oxide in the second layer 15 are not limited to a specific value. A non-limiting embodiment thereof is a configuration in which the first layer 13 includes the titanium carbonitride as a main component, and the second layer 15 includes the aluminum oxide as a main component. The term "main component" denotes a component having the largest value in mass % among values of other components.

The first layer 13 may include a component other than the titanium carbonitride, and the second layer 15 may include a component other than the aluminum oxide. For example, bondability between the first layer 13 and the second layer 15 is improved if the first layer 13 includes the aluminum oxide and the second layer 15 includes the titanium compound such as the titanium carbonitride.

Figure 4:
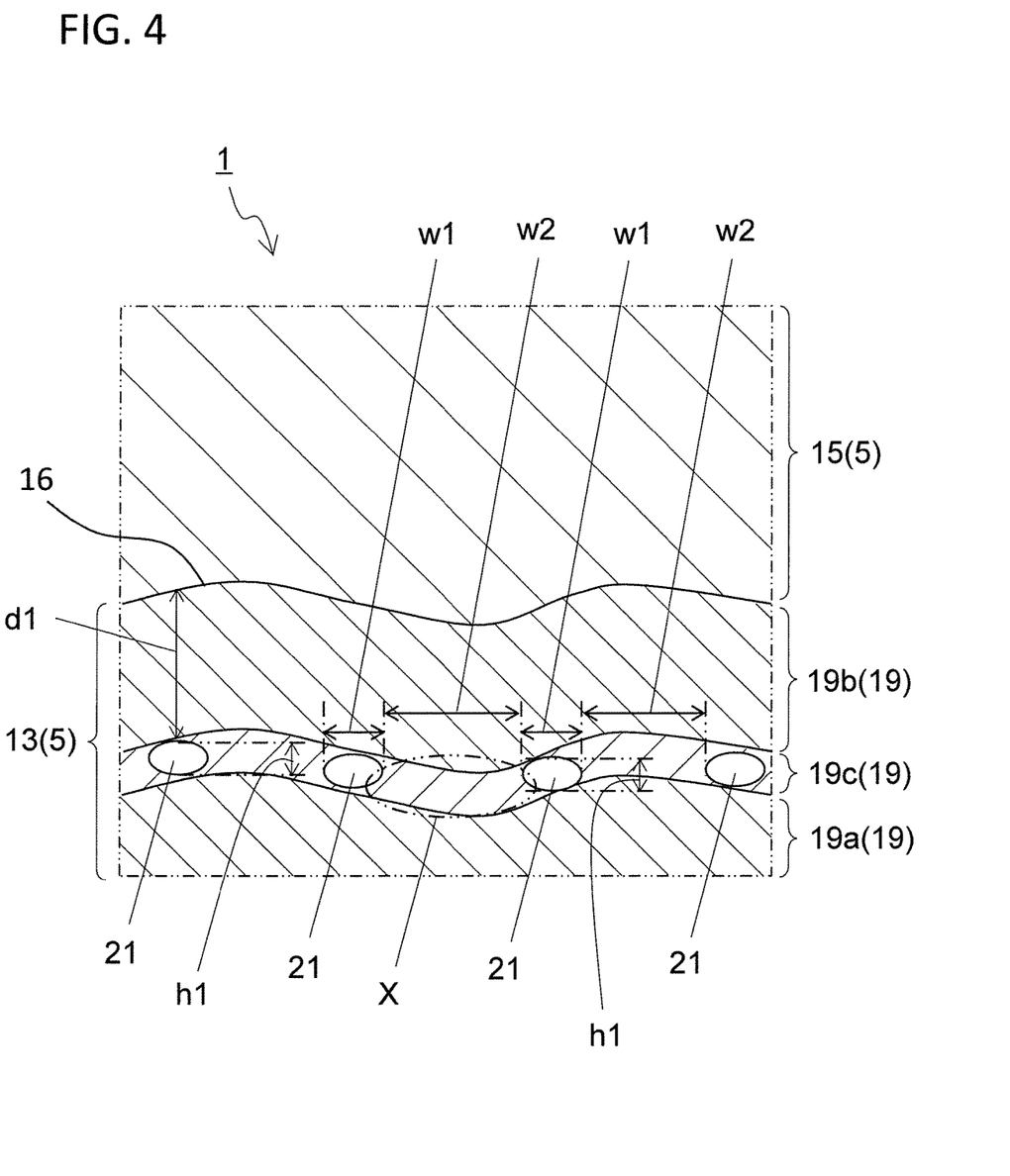
FIG. 4 is an enlarged view in a region B1 illustrated in FIG. 3.

The coating layer 5 includes the voids 21 in an interior of the first layer 13 as illustrated in FIG. 4. Specifically, the coating layer 5 includes the plurality of voids 21 located side by side in the first layer 13, in a direction along the boundary 16 between the first layer 13 and the second layer 15 in a cross section orthogonal to the first surface 7 of the base member 3.

In the coated tool 1 of the present disclosure, an average value of widths w1 of the voids 21 in a direction parallel to the first surface 7 in the cross section orthogonal to the first surface 7 is smaller than a distance between the voids 21 adjacent to each other, namely, an average value of widths w2 at the first portion X. The coated tool 1 including such a configuration can obtain high impact resistance in the voids 21 while reducing degradation of strength of the first portion X. As a result, the coated tool 1 of the present disclosure includes high impact resistance and good bondability.

In evaluating the average value of the widths w1 of the voids 21 in the direction parallel to the first surface 7, it is unnecessary to evaluate the widths w1 of all the voids 21 existing in the cross section orthogonal to the first surface 7, but the average value may be evaluated by an average value of the widths w1 of approximately 10 voids 21 located side by side in the cross section. For example, a 10 μm square region including the boundary between the first layer 13 and the second layer 15 may be extracted in the cross section orthogonal to the first surface 7, and the widths w1 of the voids 21 in the region may be measured. An average value of the widths w2 of the first portion X may be evaluated by an average value of distances between approximately 5 voids 21 located side by side in the cross section.

Figure 5:
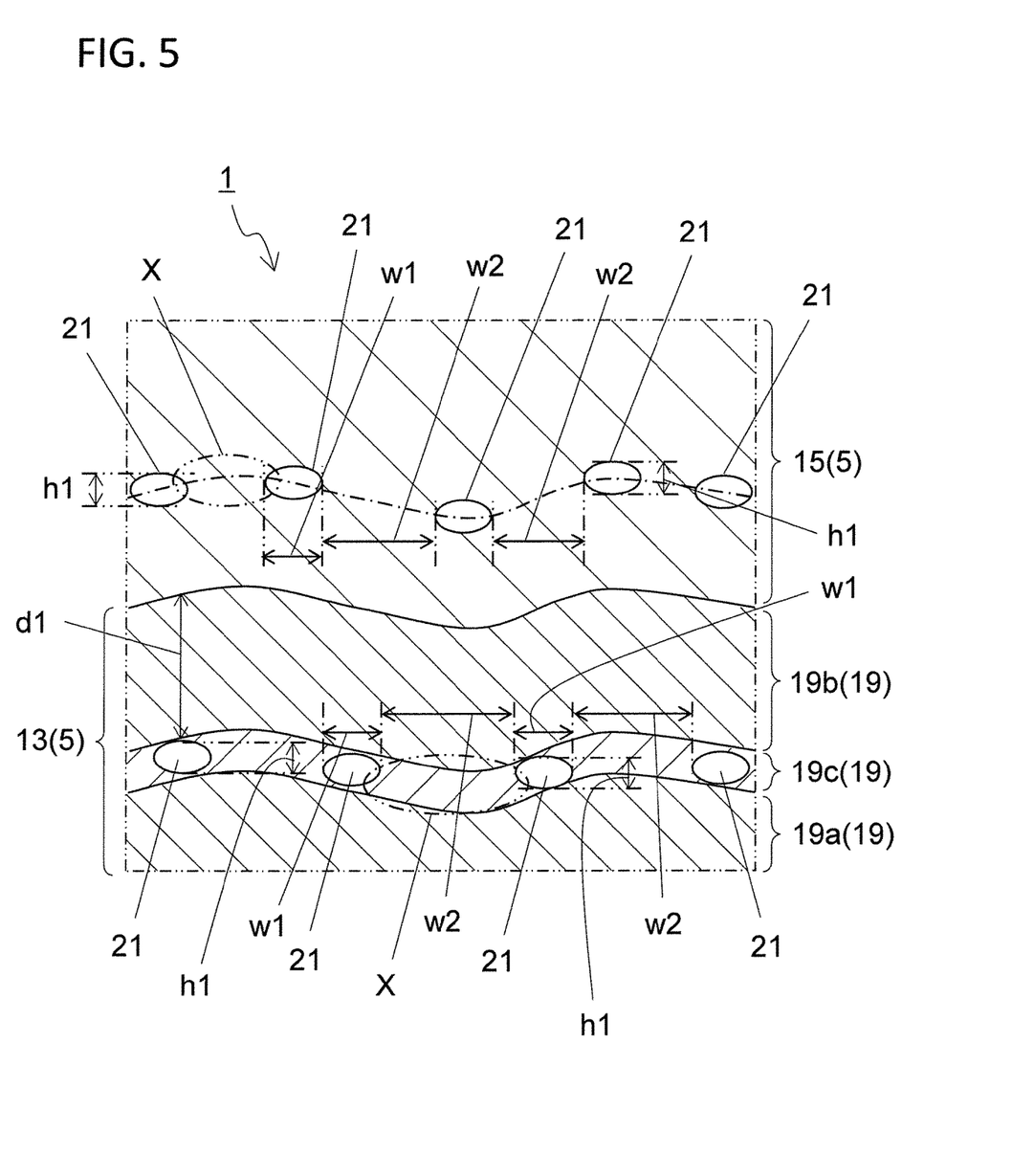
FIG. 5 is an enlarged view of another non-limiting embodiment in the region B1 illustrated in FIG. 3.

The voids 21 may exist in the first layer 13, and may include, for example, not only the configuration located in the first layer 13 as illustrated in FIG. 4, or a configuration located in each of the first layer 13 and the second layer 15 as illustrated in FIG. 5. An imaginary line segment along the boundary between the first layer 13 and the second layer 15 is indicated by a chain line in FIG. 5, and the voids 21 located in the second layer 15 may be located along the boundary between the first layer 13 and the second layer 15.

The phrase that "the voids 21 are located along the boundary between the first layer 13 and the second layer 15" denotes that distances from the plurality of voids 21 to the boundary between the first layer 13 and the second layer 15 fall within a range of ±20% of an average value thereof.

In cases where the second layer 15 includes α-alumina as aluminum oxide from the viewpoint of heat resistance and durability of the coated tool 1, the durability of the coated tool 1 can be further enhanced if the plurality of voids 21 are located in the first layer 13.

The reason for this is as follows. Hardness of the titanium carbonitride is higher but impact resistance thereof is lower than that of α-alumina. Therefore, if the voids 21 are located in the first layer 13, impact resistance because of the voids 21 can be enhanced in the first layer 13, and the durability of the coated tool 1 can be further enhanced.

Although no particular limitations are imposed on size of the voids 21, the size is settable to, for example, 20-200 nm. The impact relaxation effect because of the voids 21 can be enhanced if the size of the voids 21 is 20 nm or more. It is easy to maintain the strength of the first layer 13 if the size of the voids 21 is 200 nm or less. The term "size of the voids 21" denotes the maximum value of the widths w1 of the voids 21 in the cross section orthogonal to the first surface 7.

No particular limitations are imposed on shape of the voids 21. The impact resistance can be further enhanced while reducing a ratio of the voids 21 if the width w1 in the direction parallel to the first surface 7 is larger than a height h1 in the direction orthogonal to the first surface 7, in other words, if an average value of the widths w1 of the voids 21 in the direction parallel to the first surface 7 is larger than an average value of the heights h1 of the voids 21 in the direction orthogonal to the first surface 7 in the cross section orthogonal to the first surface 7. The reason for this is as follows.

During a cutting process of a workpiece for the purpose of manufacturing a cut product, the coating layer 5 is susceptible to a cutting load in the direction orthogonal to the first surface 7. If the voids 21 have such a shape that the width w1 in the direction parallel to the first surface 7 is larger than the height h1 in the direction orthogonal to the first surface 7, the cutting load can be absorbed in a wide range of the voids 21 without making the voids 21 larger than necessary. This makes it possible to further enhance the impact resistance while reducing the ratio of the voids 21.

Specifically, the cutting load tends to be absorbed in a wide range of the voids 21 if a ratio of the average value of the widths w1 of the voids 21 in the direction orthogonal to the first surface 7 to the average value of the heights h1 of the voids 21 in the direction parallel to the first surface 7 is 1.2 or more. Additionally, if the above ratio is 2 or less, it is easy to ensure a deformation amount of the voids 21 in the direction orthogonal to the first surface 7, thus leading to stable absorption of the cutting load in the voids 21.

If the average value of the heights h1 of the voids 21 in the direction orthogonal to the first surface 7 is smaller than Rz where Rz is a maximum height of the boundary between the first surface 7 and the second surface 9 in the cross section orthogonal to the first surface 7, it is easy to reduce degradation of the durability of the coating layer 5.

The coated tool 1 of the present disclosure has the enhanced impact resistance because of deformation of the first portion X located between the voids 21 adjacent to each other and because of deformation of the plurality of voids 21 in the first layer 13. If an average value of widths of the voids 21 in the direction orthogonal to the first surface 7 is smaller than Rz, an imaginary line connecting the voids 21 adjacent to each other is indicated by a zigzag shape that is bent larger than the width of the void 21.

In cases where the imaginary line is indicated by the above shape, even if a crack occurs at one of the first portions X, the crack is less likely to propagate to the first portion X located adjacent to the first portion X with the crack. The durability of the coating layer 5 is therefore less likely to degrade.

The durability of the coating layer 5 is also less likely to degrade if an average value of distances dl from the voids 21 to the boundary between the first layer 13 and the second layer 15 is larger than an average value of widths w2 of the first portions X in the cross section orthogonal to the first surface 7.

The reason for this is as follows. Because, in comparison with the first portions X, the above case ensures a sufficient distance from the voids 21 to the boundary between the first layer 13 and the second layer 15, even if a crack occurs at one of the first portions X, the crack is less likely to reach the boundary between the first layer 13 and the second layer 15. The bondability between the first layer 13 and the second layer 15 is less likely to degrade because the crack is less likely to reach the boundary between the first layer 13 and the second layer 15.

The voids 21 are located in the first layer 13 and located away from the boundary between the first layer 13 and the second layer 15. The bondability between the first layer 13 and the second layer 15 is less likely to degrade while achieving enhanced impact resistance in the coating layer 5 if an average value of the distances dl from the voids 21 to the boundary between the first layer 13 and the second layer 15 is larger than an average value of the heights h1 of the voids 21 in the direction orthogonal to the first surface 7 in the cross section orthogonal to the first surface 7.

The reason for this is as follows. Because, in comparison with the size of the voids 21, the distance from the voids 21 to the boundary between the first layer 13 and the second layer 15 can be sufficiently ensured, even if the voids 21 are deformed due to absorption of the cutting load, the boundary between the first layer 13 and the second layer 15 is not deformed, or the deformation amount becomes sufficiently small. The bondability between the first layer 13 and the second layer 15 is less likely to degrade because the boundary between the first layer 13 and the second layer 15 is less subjected to large deformation.

Examples of material of the base member 3 include inorganic materials, such as cemented carbide, cermet, and ceramics. The material of the base member 3 is not limited to these materials.

Examples of composition of cemented carbide include WC (tungsten carbide)-Co, WC—TiC (titanium carbide)-Co and WC—TiC—TaC (tantalum carbide)-Co. Specifically, WC, TiC and TaC are hard particles, and Co is a binding phase. The cermet is a sintered composite material obtainable by compositing metal into a ceramic component. Specific examples of the cermet include compounds composed mainly of TiC or TiN (titanium nitride).

The base member 3 may include a through hole 23 that passes through the first surface 7 and a surface located on an opposite side of the first surface 7. The through hole 23 is usable for inserting a fixing member that is intended to fix the coated tool 1 to a holder. Examples of the fixing member include a screw and a clamping member.

The size of the base member 3 is not particularly limited. For example, a length of one side of the first surface 7 may be settable to approximately 3-20 mm. A height from the first surface 7 to the surface located on the opposite side of the first surface 7 may be settable to approximately 5-20 mm.

<Manufacturing Method>

A non-limiting embodiment of a method for manufacturing the coated tool 1 of the present disclosure is described below.

Firstly, a mixed powder is manufactured by suitably adding metal powder, carbon powder or the like to inorganic powder selected from carbide, nitride, carbonitride and oxide or the like, which are capable of forming a hard alloy constituting a base member 3 by sintering, and then by mixing them together. Subsequently, a molded body is manufactured by molding the mixed powder into a predetermined tool shape with the use of a known molding method. Examples of the molding method include press molding, casting molding, extrusion molding and cold isostatic pressing. The base member 3 is manufactured by sintering the molded body in vacuum or a non-oxidizing atmosphere. A surface of the base member 3 may be then subjected to polishing process and honing process as needed.

Subsequently, a coating layer 5 is deposited on the surface of the base member 3 by chemical vapor deposition (CVD) method.

The first step is to deposit a titanium nitride layer 17 (underlayer) on the surface of the base member 3. A first mixed gas used as a reaction gas is manufactured by mixing 0.5-10 vol % of titanium tetrachloride gas and 10-60 vol % of nitrogen gas into hydrogen ($H_2$) gas. The titanium nitride layer 17 is deposited in a temperature range of 830-870° C. by introducing the first mixed gas at a gas partial pressure of 10-20 kPa into a chamber.

The next step is to deposit a first region 19a in the first layer 13. A second mixed gas is manufactured by blending 0.5-10 vol % of titanium tetrachloride gas, 1-50 vol % of nitrogen gas, 0.1-5.0 vol % of acetonitrile gas, and 0.01-0.5 vol % of methane gas into hydrogen gas. The MT-first region 19a is deposited by introducing the second mixed gas into the chamber.

The next step is to deposit an intermediate layer 19c. A third mixed gas is manufactured by blending 3-30 vol % of titanium tetrachloride gas, 3-15 vol % of methane gas, 5-10 vol % of nitrogen gas and 0.5-5 vol % of carbon dioxide ($CO_2$) gas into hydrogen gas. The intermediate region 19c having a thickness of approximately 50-300 nm is deposited in a temperature range of 980-1050° C. by introducing the third mixed gas at a gas partial pressure of 6-12 kPa into the chamber. Voids 21 are formable in the intermediate region 19c because the third mixed gas includes carbon dioxide gas. With the above conditions, a coated tool 1 in which an average value of widths w1 of the voids 21 in a direction parallel to the first surface 7 is smaller than an average value of distances w2 between the voids 21 adjacent to each other in a cross section orthogonal to the first surface 7 can be manufactured.

Additionally, since the thickness of the intermediate region 19c is as small as approximately 50-300 nm, it becomes possible to align the voids 21 formed in the intermediate region 19c in a direction along the boundary between the first layer 13 and the second layer 15.

The next step is to deposit a second region 19b in the first layer 13. A fourth mixed gas is manufactured by blending 1-4 vol % of titanium tetrachloride gas, 5-20 vol % of nitrogen gas, 0.1-10 vol % of methane gas and 0.5-10 vol % of carbon dioxide gas into hydrogen gas. The HT-second region 19b having a thickness of approximately 0.3-3 μm is deposited in a temperature range of 950-1050° C. by introducing the fourth mixed gas at a gas partial pressure of 5-45 kPa into the chamber.

The next step is to deposit a second layer 15. A deposition temperature is set to 950-1100° C., and a gas pressure is set to 5-20 kPa. A reaction gas composition is as follows. A fifth mixed gas is manufactured by blending 5-15 vol % of aluminum trichloride ($AlCl_3$) gas, 0.5-2.5 vol % of hydrogen chloride (HCl) gas, 0.5-5.0 vol % of carbon dioxide gas and 0-1 vol % of hydrogen sulfide ($H_2S$) gas into hydrogen gas. The second layer 15 is deposited by introducing the fifth mixed gas into the chamber.

Thereafter, as needed, a polishing process is carried out on a part of the surface of the deposited coating layer 5 at which the cutting edge 11 is located. If the polishing process is carried out, a workpiece is less likely to be welded onto the cutting edge 11, thus leading to the coated tool 1 having more excellent fracture resistance.

The above manufacturing method is a non-limiting embodiment of the method for manufacturing the coated tool 1 of the present disclosure. Hence, the coated tools 1 are not limited to ones which are manufactured by the above manufacturing method. For example, a third layer may be deposited separately on the second layer 15.

In order to manufacture the coated tool 1 in which the average value of the widths w1 of the voids 21 in the direction parallel to the first surface 7 is larger than an average value of the heights h1 of the voids 21 in the direction orthogonal to the first surface 7 in the cross section orthogonal to the first surface 7, time adjustment may be carried out during the deposition of the intermediate region 19c so that the intermediate region 19c is deposited in a thickness of approximately 50-150 nm.

In order to manufacture the coated tool 1 in which an average value of the distances dl from the voids 21 to the boundary 16 is larger than an average value of the heights h1 of the voids 21 in the direction orthogonal to the first surface 7 in the cross section orthogonal to the first surface 7, time adjustment may be carried out during the deposition of the intermediate region 19c so as to be deposited in a thickness of approximately 50-150 nm, and thereafter time adjustment may be carried out during the deposition of the second region 19b in the first layer 13 so as to be deposited in a thickness of approximately 0.5-3 μm.

In order to manufacture the coated tool 1 in which an average value of the distances dl from the voids 21 to the boundary 16 is larger than an average value of the distances w2 of the voids 21 adjacent to each other in the cross section orthogonal to the first surface, time adjustment may be carried out during the deposition of the second region 19b in the first layer 13 so as to be deposited in a thickness of approximately 0.5-3 μm.

<Cutting Tool>

A cutting tool 101 of the present disclosure is described below with reference to the drawings.

Figure 6:
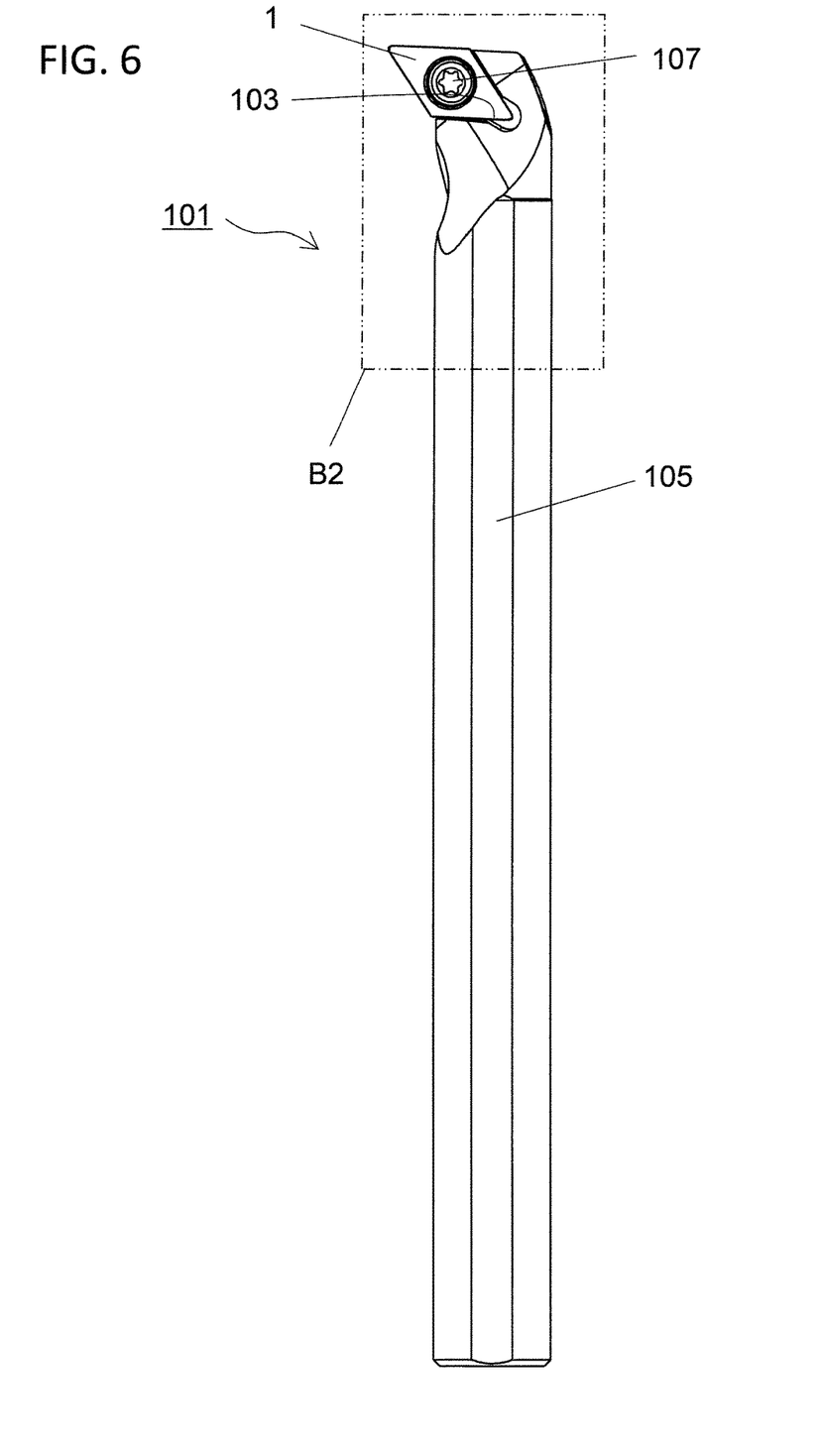
FIG. 6 is a plan view illustrating a cutting tool of the present disclosure.
Figure 7:
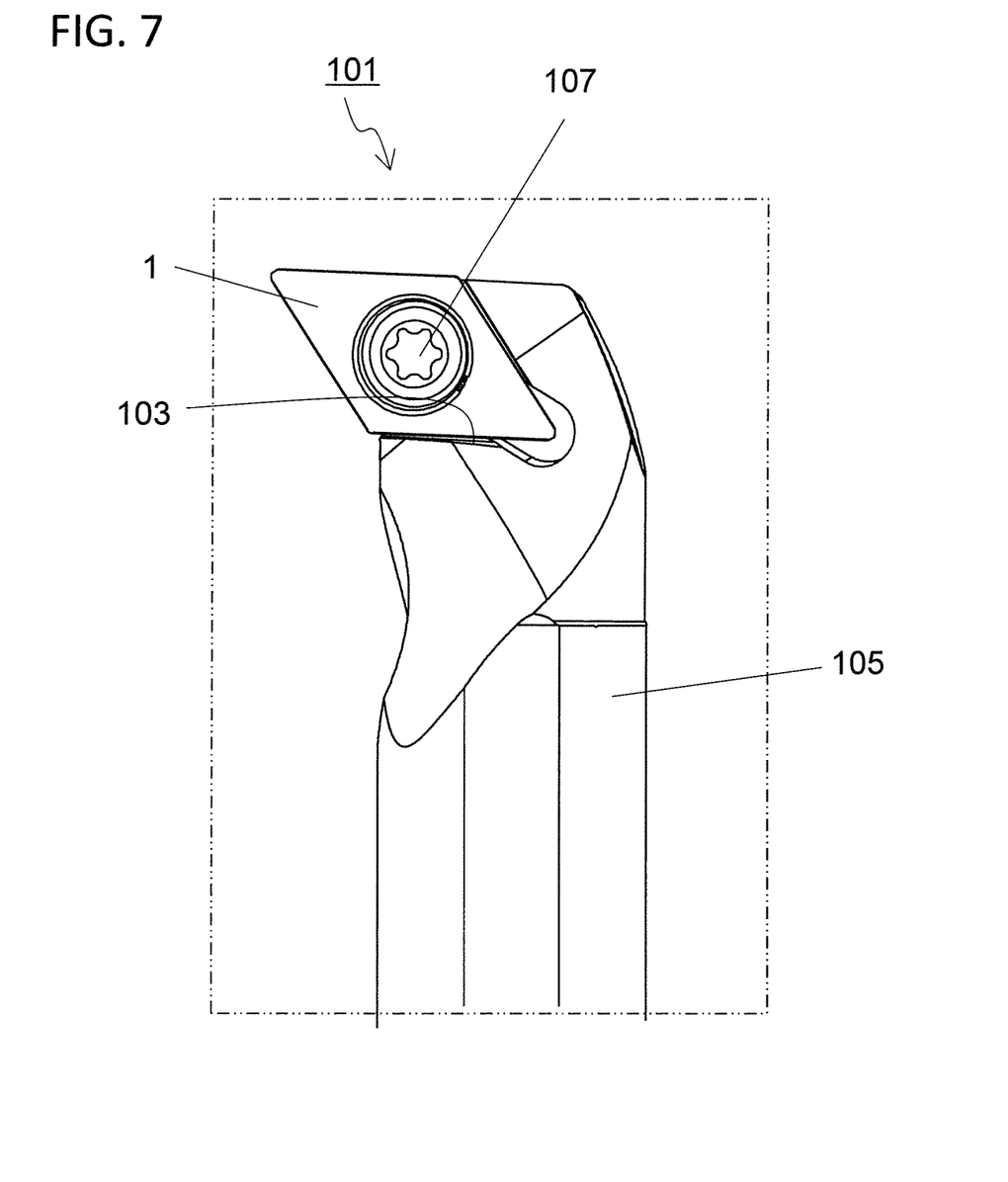
FIG. 7 is an enlarged view in a region B2 illustrated in FIG. 6.

As illustrated in FIGS. 6 and 7, the cutting tool 101 includes a holder 105 having a bar-shaped body that extends from a first end (an upper side in FIG. 6) to a second end (a lower side in FIG. 6) with a pocket 103 located at a side of the first end, and the coated tool 1 located at the pocket 103. In the cutting tool 101, the coated tool 1 is attached so that a part of the ridge line which is usable as a cutting edge is protruded from a front end of the holder 105.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located at the pocket 103. A lower surface of the coated tool 1 may be in a direct contact with the pocket 103. Alternatively, a sheet may be held between the coated tool 1 and the pocket 103.

The coated tool 1 is attached so that the part of the ridge line which is usable as the cutting edge is protruded outward from the holder 105. The coated tool 1 is attached to the holder 105 by a screw 107.

Specifically, the coated tool 1 is attached to the holder 105 in such a manner that screw parts are engaged with each other by inserting the screw 107 into the through hole of the coated tool 1, and by inserting a front end of the screw 107 into a screw hole (not illustrated) formed in the pocket 103.

For example, steel and cast iron are usable as the holder 105. High toughness steel may be used in a non-limiting embodiment.

Examples illustrated in FIGS. 6 and 7 have illustrated and described the cutting tools for use in the so-called turning process. Examples of the turning process include inner diameter processing, outer diameter processing and grooving process. The cutting tools are not limited to ones which are used for the turning process. For example, the coated tools 1 of the above non-limiting embodiment are applicable to the cutting tools for use in the milling process.

DESCRIPTION OF THE REFERENCE NUMERALS

1 coated tool
3 base member
5 coating layer
7 first surface
9 second surface
11 cutting edge
13 first layer
15 second layer
16 boundary between first layer and second layer
17 titanium nitride layer
19 titanium carbonitride layer
19a first region
19b second region
19c intermediate region
21 void
23 through hole
101 cutting tool
103 pocket
105 holder
107 fixing screw

What is claimed is:

1. A coated tool, comprising:
a base member comprising a first surface; and
a coating layer located at least on the first surface of the base member,
wherein
the coating layer comprises:
  a first layer which is located on the first surface and which comprises cubic titanium carbonitride, and
  a second layer which is located on and in contact with the first layer;
the first layer further comprises an orientation coefficient Tc (220) of the titanium carbonitride by X-ray diffraction analysis of 3.0 or more;
the coating layer further comprises a plurality of voids located side by side in the first layer, in a direction along a boundary between the first layer and the second layer in a cross section orthogonal to the first surface; and
an average value of widths of respective voids of the plurality of voids in a direction along the boundary is less than an average value of distances between the respective voids adjacent to each other.

2. The coated tool according to claim 1, wherein the second layer further comprises α-alumina.

3. The coated tool according to claim 1, wherein an average value of widths of the respective voids in a direction parallel to the first surface is greater than an average value of heights of the respective voids in a direction orthogonal to the first surface in the cross section orthogonal to the first surface.

4. The coated tool according to claim 1, wherein an average value of distances from the respective voids to the boundary is greater than an average value of heights of the respective voids in a direction orthogonal to the first surface in the cross section orthogonal to the first surface.

5. The coated tool according to claim 1, wherein an average value of distances from the respective voids to the boundary is greater than an average value of distances between the respective voids adjacent to each other in the cross section orthogonal to the first surface.

6. A cutting tool, comprising:
a holder comprising a bar shape which extends from a first end to a second end and comprises a pocket located at a side of the first end; and
the coated tool according to claim 1, which is located at the pocket.

7. A coated tool, comprising:
a base member comprising a first surface; and
a coating layer located at least on the first surface of the base member,
wherein
the coating layer comprises:
  a first layer which is located on the first surface and which comprises cubic titanium carbonitride, and
  a second layer which is located on and in contact with the first layer;
the first layer further comprises an orientation coefficient Tc (220) of the titanium carbonitride by X-ray diffraction analysis of 3.0 or more;
the coating layer further comprises a plurality of voids having an average size greater than 20 nm that are located side by side in the first layer without intervening voids therebetween, in a direction along a boundary between the first layer and the second layer in a cross section orthogonal to the first surface; and
an average value of widths of respective voids of the plurality of voids in a direction along the boundary is less than an average value of distances between the respective voids adjacent to each other.

8. The coated tool according to claim 7, wherein the second layer further comprises α-alumina.

9. The coated tool according to claim 7, wherein an average value of widths of the respective voids in a direction parallel to the first surface is greater than an average value of heights of the respective voids in a direction orthogonal to the first surface in the cross section orthogonal to the first surface.

10. The coated tool according to claim 7, wherein an average value of distances from the respective voids to the boundary is greater than an average value of heights of the respective voids in a direction orthogonal to the first surface in the cross section orthogonal to the first surface.

11. The coated tool according to claim 7, wherein
an average value of distances from the respective voids to the boundary is greater than an average value of distances between the respective voids adjacent to each other in the cross section orthogonal to the first surface.

12. A cutting tool, comprising:
a holder comprising a bar shape which extends from a first end to a second end and comprises a pocket located at a side of the first end; and
the coated tool according to claim 7, which is located at the pocket.

* * * * *